United States Patent
Chen et al.

[11] Patent Number: 6,143,618
[45] Date of Patent: Nov. 7, 2000

[54] PROCEDURE FOR ELIMATING FLOURINE DEGRADATION OF $WSI_x$/OXIDE/POLYSILICON CAPACITORS

[75] Inventors: Hsin-Pai Chen, Hsin-Chu; Ching-Tang Tsai, Chang-Hua; Tien-Chen Chang; Yung-Haw Liaw, both of Hsin-Chu, all of Taiwan

[73] Assignee: Taiwan Semiconductor Manufacturing Company, Hsin-Chu, Taiwan

[21] Appl. No.: 09/156,360

[22] Filed: Sep. 18, 1998

[51] Int. Cl.[7] ..................................................... H01L 21/20
[52] U.S. Cl. ........................... 438/396; 438/301; 438/305; 438/308; 438/350; 257/295; 257/377; 257/386
[58] Field of Search ............................... 437/44, 200, 247, 437/190, 193, 192; 438/592, 197, 301, 305, 308, 530; 257/386, 295, 377

[56] References Cited

U.S. PATENT DOCUMENTS

| | | | |
|---|---|---|---|
| 5,273,920 | 12/1993 | Kwasnick et al. | 437/40 |
| 5,364,803 | 11/1994 | Lur et al. | 437/40 |
| 5,434,096 | 7/1995 | Chu et al. | 438/305 |
| 5,527,718 | 6/1996 | Seita et al. | 437/11 |
| 5,668,394 | 9/1997 | Lur et al. | 257/413 |
| 5,717,242 | 2/1998 | Michael et al. | 257/386 |
| 5,767,004 | 6/1998 | Balasubramanian et al. | 438/592 |
| 5,981,347 | 11/1999 | Kuo et al. | 438/308 |

*Primary Examiner*—David Nelms
*Assistant Examiner*—Phuc T. Dang
*Attorney, Agent, or Firm*—George O. Saile; Stephen B. Ackerman

[57] ABSTRACT

A method for forming a polycide/oxide/polysilicon capacitor on a silicon wafer with improved dielectric stability and reliability is described wherein an in-situ high temperature anneal is applied to the wafer within a CVD reactor immediately prior to the deposition of the silicon oxide capacitor dielectric layer. The in-situ anneal causes sufficient fluorine outgassing of the polycide layer to prevent fluorine degradation of the subsequently deposited oxide capacitor dielectric. The capacitance of the completed capacitor is increased by as much as 10% when compared to a comparable not in-situ anneal conducted prior to the insertion of the wafer into the CVD reactor.

20 Claims, 3 Drawing Sheets

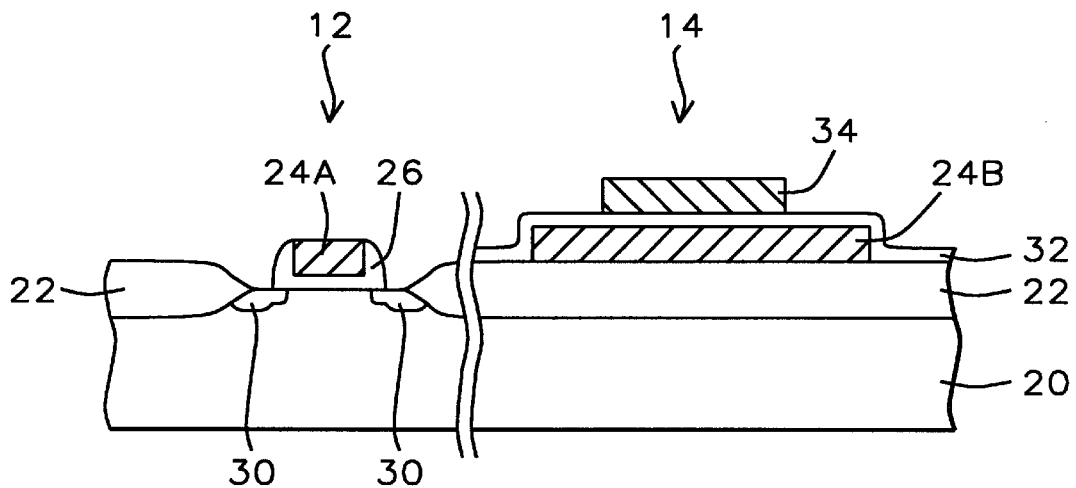
FIG. 1 – Prior Art
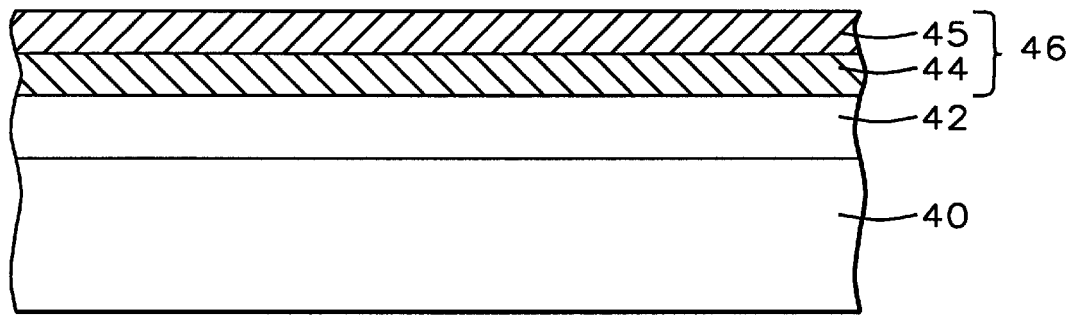
FIG. 2
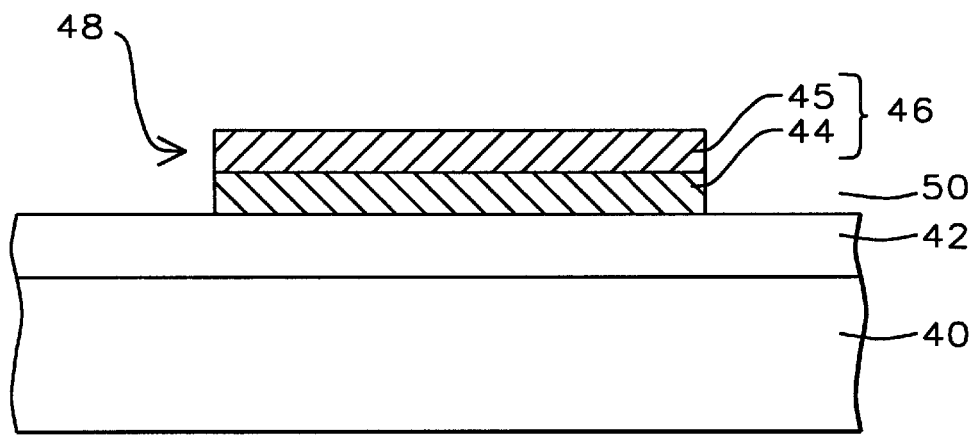
FIG. 3

PROCEDURE FOR ELIMATING FLOURINE DEGRADATION OF WSI$_x$/OXIDE/POLYSILICON CAPACITORS

BACKGROUND OF THE INVENTION (1) Field of the Invention

The invention relates to processes for the manufacture of semiconductor devices and more particularly to processes for forming capacitors in conjunction with the formation of self-aligned-polysilicon-gate field effect transistors.

(2) Background of the Invention and Description of Prior Art

Complimentary metal oxide semiconductor(CMOS) field effect transistor(FET) technology involves the formation and utilization of n-channel MOSFETs(NMOS) and p-channel MOSFETs(PMOS) in combination to form low current, high performance integrated circuits. The complimentary use of NMOS and FPMOS devices, typically in the form of a basic inverter device, allows a considerable increase of circuit density of circuit elements by reduction of heat generation. The increase in device density accompanied by the shrinkage of device size has resulted in improved circuit performance and reliability as well as reduced cost. For these reasons CMOS integrated circuits have found widespread use.

Many integrated circuit designs include capacitors, the formation of which must be incorporated into the manufacturing process. In the manufacture of dynamic random access memory (DRAM) integrated circuits, a number of processing steps are included in the process sequence which are dedicated exclusively to the formation of the memory cell storage capacitor. Other capacitors, are used in certain logic circuits, in peripheral memory support circuits, and in mixed-mode circuits. These capacitors can be formed simultaneously with the formation of the MOSFETs without requiring additional processing steps. Such capacitors utilize the same layers which are used to form the MOSFETs. Because they are simultaneously formed, they are also easily incorporated into the MOSFET interconnection circuitry.

A well known mixed mode integrated circuit includes a tungsten polycide-to-polysilicon capacitors and a CMOS device with a polycide gates. The devices are shown in cross section in FIG. 1. The MOSFET 12 is formed over an active area on a silicon wafer 20 and is isolated by a field oxide 22. The gate electrode 24A is formed of a polycide layer, which comprises a lower portion of polysilicon and an upper portion of a refractory metal silicide. The upper silicide layer improves the overall conductivity of the electrode. The polysilicon and the superjacent silicide layers are deposited by low temperature chemical vapor deposition (LPCVD). A preferred silicide is tungsten silicide(WSi$_x$) which is formed over the polysilicon layer by the reaction of SiH$_4$ with WF$_6$. The MOSFET 12 is provided with the well known LDD (lightly doped drain) structure 30 which is formed by the use of sidewalls 26.

In another region of the wafer 20 a capacitor 14 is formed over a region of field oxide 22. The lower plate 24B is patterned in the same polycide layer as the gate electrode 24A. The dielectric material of the capacitor 14 is formed of a silicon oxide layer 32 which is also deposited by LPCVD using silane (SiH$_4$) or dichlorosilane(SiCl$_2$H$_2$) and N$_2$O or O$_2$ as precursors. Oxide layer 32 is a component of an inter-poly-oxide(IPO) layer through which contact to the MOSFETs are formed. The upper electrode plate 34 of capacitor 14 is patterned in a second layer of doped polysilicon in which interconnective conductive links to the MOSFETs are also formed.

A problem occurs when the capacitor the dielectric layer 32 is deposited over the WSi$_x$ lower plate 24B. During formation of the WSi$_x$, some of the product gases including fluorine are retained in the WSi$_x$ layer. During the initial stage of deposition of the oxide layer 32 which takes place at a temperature of about 800° C., the WSi$_x$ layer out gasses into the oxide layer, forming gas pockets which degrade the dielectric layer by lowering its capacitance. WSi$_x$ outgassing can reduce the capacitance by as much as 10%. The degradation of the dielectric also presents a reliability concern.

The outgassing of tungsten silicide layers is well known. Chu et.al., U.S. Pat. No. 5,434,096 cites the delamination of a dielectric layer deposited over tungsten polycide gate electrodes caused by outgassing of the tungsten silicide. An anneal in an inert gas and oxygen at 900° C. is applied after patterning of the polycide gate electrodes. An additional 20 minute anneal in vacuum or inert gas at 800° C. is performed after BF$_2$+ implantation of p-channel devices. These annealing steps are sufficient to prevent delamination. However, experiments by the present inventors have shown that such annealing steps are ineffective in eliminating capacitance degradation of the polycide/oxide/polysilicon capacitor.

Seita et.al., U.S. Pat. No. 5,527,718 cites a method for removing impurities, in particular fluorine, from polycide electrodes by heat treatment at temperatures between 450 and 800° C. It was found that the anneal which was used to activate the polysilicon dopant at temperatures above 700° C. caused fluorine embedded in the tungsten silicide to migrate and pile up at the subjacent polysilicon-gate oxide interface, thereby promoting enhanced oxidation of the gate oxide. A lower temperature anneal prior to the activation anneal drove out sufficient fluorine to alleviate the gate oxide problem. The preliminary anneal is performed at a temperature no less than the electrode formation temperature and no higher than the growth temperature of the gate insulating film.

Lur et.al., 5,668,394 also addresses fluorine induced gate oxide degradation by introducing a conducting barrier layer of TiN between the tungsten silicide layer and the gate polysilicon layer thereby preventing the migration of fluorine towards the polysilicon/gate oxide interface.

Kwasnick et.al., 5,273,920 shows a method of fabricating an amorphous silicon inverted thin film transistor using a hydrogen plasma treatment of the gate dielectric(silicon nitride) prior to the deposition of the amorphous silicon. Both depositions and the intermediate plasma treatment are advantageously applied successively in the same reactor without breaking vacuum. However, vacuum may be broken after the deposition of the dielectric and before the plasma treatment. The hydrogen plasma improves the effective mobility of carriers in the semiconductor layer.

SUMMARY OF THE INVENTION

It is an object of this invention to provide a method for preventing fluorine induced capacitance degradation of polycide/oxide/polysilicon capacitors.

It is another object of this invention to provide a method for removing volatile impurities, in particular fluorine species, from metal silicide layers prior to the deposition of a dielectric layer and thereby preventing said volatile impurities from degrading the dielectric characteristics of said dielectric layer.

It is yet another object of this invention to provide a method for forming a polycide/oxide/polysilicon capacitor with improved dielectric stability and reliability.

These objects are achieved by performing an in-situ high temperature anneal of the metal silicide layer preceding the silicon oxide dielectric layer deposition. The anneal, which provides degassing of the metal silicide, is performed in the CVD reactor wherein the silicon oxide layer is deposited, at a temperature greater than the oxide deposition temperature. The wafer, with exposed metal silicide, is loaded into the CVD reactor operating in standby mode. The reactor is stabilized at a higher temperature and a nitrogen gas flow is admitted. wafer temperature is ramped up to about 50° C. above the oxide deposition temperature and maintained for about one hour in the nitrogen flow. The reactor temperature is then ramped down to the oxide deposition temperature, and purged with $N_2$ and $N_2O$. Oxide deposition then proceeds by admitting the a gas flow containing the oxide precursors.

Because the diffusions of the semiconductive devices are already in place at the time of the annealing step introduced by the current invention, the temperature of the anneal is limited to prevent device degradation.

BRIEF DESCRIPTION OF THE DRAWINGS

FIG. 1 is a cross sectional view of a wafer showing a region having a MOSFET and another region wherein a capacitor is formed.

FIG. 2 through FIG. 4 are cross sections of a wafer showing the process steps for the formation of a polycide/oxide/polysilicon capacitor over a region of field oxide according to the method of this invention.

DESCRIPTION OF THE PREFERRED EMBODIMENT

Figure 4:
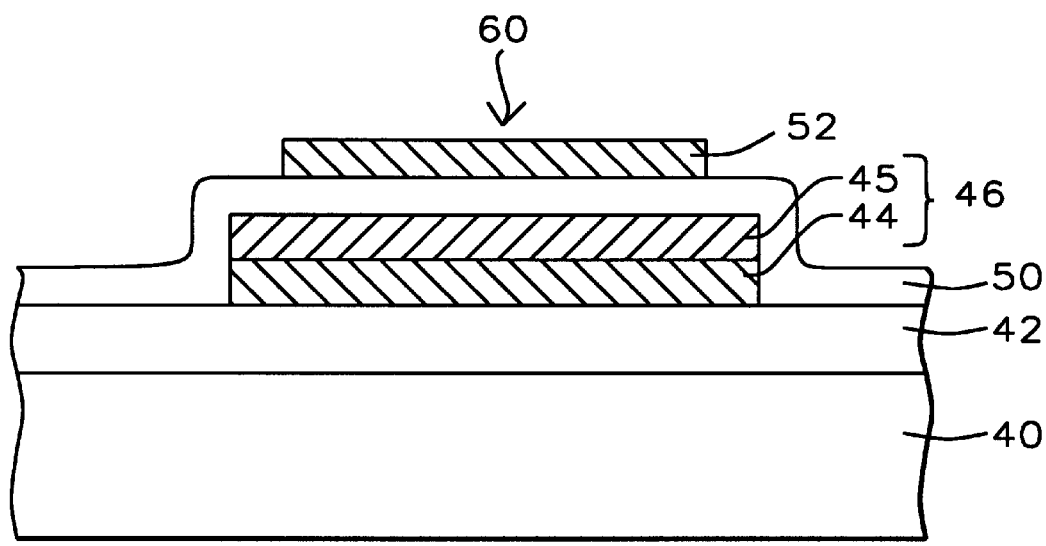

In a preferred embodiment of this invention monocrystalline silicon wafer 40 is provided. Referring to FIG. 2, there is shown a cross section of a portion of the wafer 40 whereon a polycide/oxide/polysilicon capacitor is to be formed. The process steps for the formation of the capacitor will be described and illustrated specifically with reference to the formation of the capacitor. However, these process steps are to be understood to include the formation of devices elsewhere on the wafer.

A field oxide 42 is formed on the wafer, preferably by the local oxidation of silicon (LOCOS), a method which is well known and widely practiced in the art. The field oxide 42 provides isolation for semiconductive devices such as MOSFETs, which are formed in elsewhere on the wafer 40. Regions of silicon wherein the MOSFETs are formed are protected from oxidation by a mask. After the formation of the field oxide 42, by the LOCOS procedure, the LOCOS mask, used to define active silicon regions for the semiconductive devices, is stripped and a gate oxide is grown over the active silicon regions. A layer of polysilicon 44 is then deposited over the wafer. The polysilicon is deposited to a thickness of between about 1,300 and 1,700 Angstroms preferably by LPCVD using well known procedures and precursors. A portion of the polysilicon layer 44 may optionally be doped by ion implantation of impurities, for example arsenic, phosphorous, or boron. These procedures are well known and widely practiced in the art and are used to form gate electrode for MOSFETs.

A layer of a refractory metal silicide 46, preferably tungsten silicide, is next deposited on the polysilicon layer 44. Other refractory silicides, for example those of titanium, tantalum or molybdenum may also be substituted. The preferred tungsten silicide is deposited by LPCVD from the precursors silane and tungsten hexafluoride ($WF_6$). The deposition is conducted at a temperature of between about 360 and 400° C. The resultant combination of a polysilicon layer with a refractory metal silicide layer over it is commonly referred to as a polycide layer. This combination is widely used for the formation of MOSFET gate electrodes. The metal silicide layer is included to improve the overall conductivity of the gate electrode.

Referring next to FIG. 3, the polycide layer 46 is then patterned using conventional photolithographic techniques to form the lower plate 48 of a capacitor. The gate electrodes of the MOSFETs, located elsewhere on the wafer 40 are also patterned by this photolithographic step. After the polycide layer 46 is patterned a number of processing steps take place wherein the semiconductive elements of the MOSFETs are formed. These processing steps include the formation of lightly doped drain structures, gate sidewall formation and source/drain ion implantation. In CMOS (complementary metal oxide silicon) integrated circuits both n- and p-channel devices are formed by alternately exposing the devices to n- and p-type ion implantation. These processing steps are well known to those in the art and are widely practiced so their detailed description is not appropriate here. During these processing steps the lower capacitor plate 48 is exposed to various depositions and etches but, after their completion, remains as shown in FIG. 3.

Referring next to FIG. 4 an insulative layer 50 is deposited over the wafer 40. The insulative layer 50 in the embodiment of this invention is silicon oxide deposited in an LPCVD reactor. The process step in which the layer 50 is deposited contains the key feature of the current invention.

Figure 5:
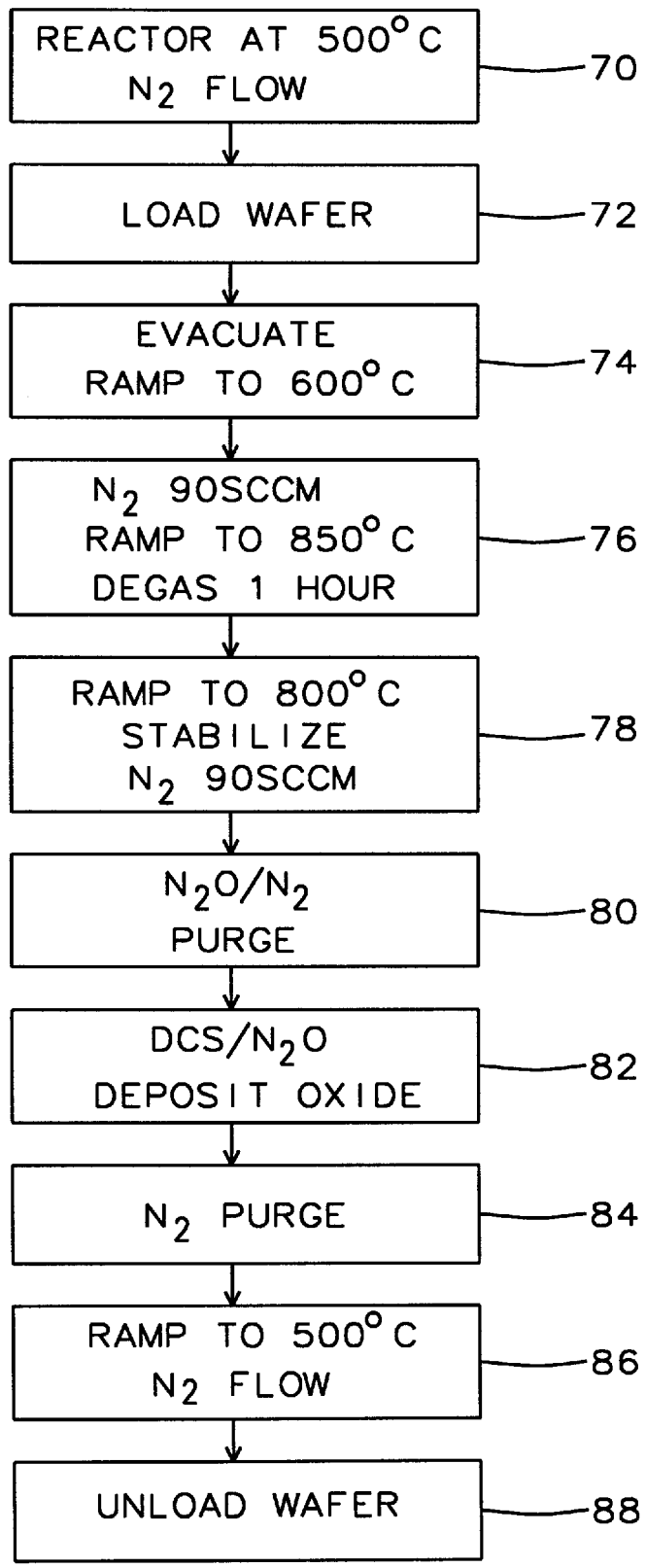
FIG. 5 is a flow chart showing the sequence process steps used in forming the oxide layer of a polycide/oxidelpolysilicon capacitor in order to effect the objects of the current invention.

FIG. 5 is a flow chart illustrating the sequence of key process steps which take place in the LPCVD reactor leading to and including the deposition of the silicon oxide layer 50. Accordingly the wafer 40 having the exposed polycide capacitor storage plate 48 is loaded into the deposition chamber of a conventional LPCVD reactor. The reactor is operated in a standby mode 70(FIG. 5) at a temperature of 500° C. or thereabout under a flow of $N_2$ of 3000 SCCM (Standard cubic centimeters per minute) or thereabout.

The wafer 40 is loaded into the reaction chamber 72(FIG. 5), the chamber is evacuated 74(FIG. 5) and the wafer temperature is ramped up to 600° C. or thereabout. A flow of 90 SCCM or thereabout of $N_2$ is begun and the wafer temperature is ramped up further to 850° C. or thereabout 76(FIG. 5). The temperature is stabilized and maintained for a period of one hour or thereabout. Nitrogen flow is maintained at a flow rate of about 90 SCCM over this period and the pressure in the reactor is throttled to about 450 mTorr. During this annealing period residual fluorine from within the metal silicide layer 45 is discharged.

After the anneal period the wafer temperature is lowered 80(FIG. 5) and stabilized at the silicon oxide deposition temperature of 800° C. or thereabout. A flow of 180 SCCM or thereabout of $N_2O$ is then added to the 90 SCCM $N_2$ flow to purge the chamber of residual fluorine 80(FIG. 5). The silicon oxide deposition is then performed 82(FIG. 5) by admitting a flow of dichlorosilane at 90 SCCM or thereabout and $N_2O$ at 180 SCCM or thereabout. The temperature and flow is maintained for a period sufficient to deposit a desired thickness of silicon oxide. The thickness of the dielectric layer 50 in this embodiment is preferably between about 350 and 390 Angstroms although the thickness is not restricted to this range.

Following deposition of the oxide layer 50(FIG. 4) the reactant gas flow is stopped and the reactor purged with nitrogen at 500 SCCM or thereabout 84(FIG. 5) as the temperature is lowered to the standby condition at 500° C. or thereabout 86(FIG. 5). The wafer 40 is then unloaded from the CVD reactor 88(FIG. 5).

Referring again to FIG. 4, a polysilicon layer 52 is deposited, preferably by LPCVD on the dielectric layer 50. The polysilicon layer is preferably made conductive by in-situ incorporation of a dopant impurity, for example, phosphorous or boron. However, it may also be deposited undoped and then ion implanted with a dopant impurity. Deposition and doping methods for conductive polysilicon layers are well known to those in the art. The conductive polysilicon layer is then patterned by conventional photolithographic methods to form an upper capacitor plate, thereby completing the formation of the capacitor 60.

Experiments were performed to determine the effectiveness of the in-situ anneal during the oxide deposition step. A split run was made in which control wafers were annealed at 850° C. prior to insertion into the CVD reactor. Other wafers received the 850° C. anneal within the CVD reactor according to the procedure just described. The dielectric thickness was the same on all wafers. Capacitors were then formed and their capacitances measured. The capacitors on the in-situ annealed wafers had a capacitance approximately 10% greater than that of the capacitors formed on the control wafers. No difference was noted in the breakdown voltage of the capacitor dielectric.

While this invention has been particularly shown and described with reference to the preferred embodiments thereof, it will be understood by those skilled in the art that various changes in form and details may be made without departing from the spirit and scope of the invention.

What is claimed is:

1. A method for depositing a silicon oxide dielectric layer on a polycide layer comprising:
   (a) providing a substrate having a polycide layer;
   (b) loading said substrate into a CVD reactor at a first temperature;
   (c) evacuating said CVD reactor;
   (d) ramping said substrate to a second temperature;
   (e) introducing a first gas flow into said CVD reactor;
   (f) ramping said substrate to a third temperature;
   (g) maintaining said substrate at said third temperature and said first gas flow for a time period;
   (h) ramping said substrate to a fourth temperature, said fourth temperature being less than said third temperature;
   (i) purging said reactor with a gas flow containing $N_2$ and $N_2O$;
   (j) introducing a third gas flow containing dichlorosilane and $N_2O$ into said CVD reactor, whereby a silicon oxide dielectric layer is deposited on said substrate at said fourth temperature;
   (k) introducing a fourth gas flow in said reactor;
   (l) ramping said substrate to said first temperature; and
   (m) unloading said substrate.

2. The method of claim 1 wherein said polycide layer is tungsten silicide on polysilicon.

3. The method of claim 2 wherein said first temperature is 500° C. or thereabout.

4. The method of claim 2 wherein said second temperature is 600° C. or thereabout.

5. The method of claim 2 wherein said first gas flow contains $N_2$ at a flow rate of 90 SCCM or thereabout.

6. The method of claim 2 wherein said third temperature is 850° C. or thereabout.

7. The method of claim 2 wherein said fourth temperature is 800° C. or thereabout.

8. The method of claim 1 wherein said time period is one hour or thereabout.

9. The method of claim 1 wherein said second gas flow consists of $N_2$ at a flow rate of 90 SCCM or thereabout and $N_2O$ at a flow rate of 180 SCCM or thereabout.

10. The method of claim 1 wherein said fourth gas flow comprises of $N_2$ at a flow rate of 90 SCCM or thereabout.

11. A method for forming a capacitor with a polycide plate comprising:
    (a) providing a substrate with a first insulative layer;
    (b) forming a polycide layer over said first insulative layer;
    (c) patterning said polycide layer to form a first capacitor plate;
    (d) loading said substrate into a CVD reactor at a first temperature;
    (e) evacuating said CVD reactor;
    (f) ramping said substrate to a second temperature;
    (g) introducing a first gas flow into said CVD reactor;
    (h) ramping said substrate to a third temperature;
    (i) maintaining said substrate at said third temperature and under said first gas flow for a time period;
    (j) ramping said substrate to a fourth temperature, said fourth temperature being less than said third temperature;
    (k) purging said reactor with a second gas flow containing $N_2$ and $N_2O$;
    (l) introducing a third gas flow into said CVD reactor, said third gas flow containing dichlorosilane and $N_2O$ into said CVD reactor, whereby a silicon oxide dielectric layer is deposited on said substrate at said fourth temperature;
    (m) introducing a fourth gas flow in said reactor;
    (n) ramping said substrate to said first temperature;
    (o) unloading said substrate from said CVD reactor; and
    (p) depositing and patterning a conductive layer on said second insulative layer to form a second capacitor plate.

12. The method of claim 11 wherein said polycide layer is tungsten silicide on polysilicon.

13. The method of claim 11 wherein said first temperature is 500° C. or thereabout.

14. The method of claim 11 wherein said second temperature is 600° C. or thereabout.

15. The method of claim 12 wherein said first gas flow consists of $N_2$ at a flow rate of 90 SCCM or thereabout.

16. The method of claim 12 wherein said third temperature is 850° C. or thereabout.

17. The method of claim 12 wherein said fourth temperature is 800° C. or thereabout.

18. The method of claim 12 wherein said time period is one hour or thereabout.

19. The method of claim 12 wherein said second gas flow consists of $N_2$ at a flow rate of 90 SCCM or thereabout and $N_2O$ at a flow rate of 180 SCCM or thereabout.

20. The method of claim 11 wherein said fourth gas flow comprises of $N_2$ at a flow rate of 90 SCCM or thereabout.

* * * * *